United States Patent
Park

(10) Patent No.: US 7,489,578 B2
(45) Date of Patent: Feb. 10, 2009

(54) BOOSTED VOLTAGE LEVEL DETECTOR IN SEMICONDUCTOR MEMORY DEVICE

(75) Inventor: Kee-Teok Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 146 days.

(21) Appl. No.: 11/647,127

(22) Filed: Dec. 29, 2006

(65) Prior Publication Data

US 2007/0153603 A1    Jul. 5, 2007

(30) Foreign Application Priority Data

Dec. 29, 2005    (KR) ...................... 10-2005-0134184

(51) Int. Cl.
G11C 7/04    (2006.01)
(52) U.S. Cl. .................. 365/211; 365/189.09
(58) Field of Classification Search ................. 365/211, 365/189.09, 189.11
See application file for complete search history.

(56) References Cited

U.S. PATENT DOCUMENTS

| | | | |
|---|---|---|---|
| 5,303,191 A * | 4/1994 | Eagan et al. ................. | 365/194 |
| 6,807,111 B2 * | 10/2004 | Marotta et al. ......... | 365/189.09 |
| 6,876,247 B2 | 4/2005 | Jang et al. | |
| 2003/0198114 A1 * | 10/2003 | Fiscus ........................ | 365/211 |
| 2004/0239409 A1 | 12/2004 | Jang et al. | |

FOREIGN PATENT DOCUMENTS

| | | |
|---|---|---|
| JP | 6-96593 A | 4/1994 |
| JP | 2004-344788 A | 12/2004 |
| KR | 0107779 | 8/1996 |
| KR | 10-2005-0056373 | 6/2005 |

OTHER PUBLICATIONS

Korean Office Action, with English translation, issued in Korean Patent Application No. KR 10-2005-0134184, mailed Jul. 22, 2008.

* cited by examiner

Primary Examiner—Anh Phung
(74) Attorney, Agent, or Firm—McDermott Will & Emery LLP

(57) ABSTRACT

A voltage level of a boosted voltage is prevented from being targeted at voltage level that is too low, thereby improving a write recovery time (tWR) characteristic in a memory in a semiconductor memory device. The boosted voltage level detector includes: a voltage divider for dividing a boosted voltage and outputting a divided voltage; and a comparison unit for comparing a reference voltage corresponding to a voltage level of a target voltage with the divided voltage and outputting a level detecting signal, wherein the voltage divider includes: a first voltage drop element connected between a boosted voltage terminal and an output terminal of the voltage divider, having a negative temperature coefficient; and a second voltage drop element connected between the output terminal of the voltage divider and a ground voltage terminal, having a positive temperature coefficient.

9 Claims, 4 Drawing Sheets

BOOSTED VOLTAGE LEVEL DETECTOR IN SEMICONDUCTOR MEMORY DEVICE

CROSS-REFERENCE TO RELATED APPLICATIONS

The present invention claims priority of Korean patent application no. 10-2005-0134184, filed on Dec. 29, 2005 which is incorporated by reference in its entirety.

BACKGROUND OF THE INVENTION

The present invention relates to a semiconductor memory device architecture technology; and, more particularly, to a boosted voltage level detector for a boosted voltage generator.

Generally, most semiconductor memory devices include an internal voltage generator for generating an internal voltage by using a power supply voltage VDD supplied from an external circuit of a chip so that a voltage to be required in the operation of an internal circuit is generated in the memory device itself. The key issue in the architecture of the internal voltage generator is to stably supply the internal voltage in a desired voltage level.

As the scaling down in the line width of integrated circuits in the semiconductor memory device is continuously achieved, a low voltage operation based on the power supply voltage is much more general. Accordingly, the architecture technology is also required to satisfy the performance of the device in a low voltage operation.

In this low voltage environment, the semiconductor memory devices have a voltage booster to generate a boosted voltage VPP which is higher than the power supply voltage VDD in order to compensate for the loss of the voltage in the circuits using the power supply voltage VDD and to normally maintain the data processed in the circuits.

Particularly, in DRAM, the boosted voltage VPP has been widely used for the purpose of compensating for the voltage loss caused by a threshold voltage of a MOS transistor in a word line driving circuit, a bit line dividing circuit, a data output buffer, and so on.

Typically, a boosted voltage generator includes a boosted voltage level detector for detecting a voltage level of a boosted voltage VPP based on a reference voltage corresponding to a target voltage, an oscillator for producing a period signal in response to a level detection signal output from the boosted voltage level detector, and a charge pumping circuit for performing an electric charge pumping operation in response to the period signal and for producing the boosted voltage VPP.

FIG. 1 is a circuit diagram of a boosted voltage level detector according to a conventional memory device. The boosted voltage level detector according to the conventional memory device has a voltage divider 100 for dividing the boosted voltage VPP and outputting a divided voltage VPP_REF and a comparison unit 200 which compares the divided voltage VPP_REF with a reference voltage VREFC corresponding to a target voltage and outputting a level detection signal PPE.

The voltage divider 100 has first and second resistors Ra and Rb which are in series connected to each other between a boosted voltage terminal and a ground voltage terminal. The divided voltage VPP_REF, which is an output signal of the voltage divider 100, is a voltage which is determined by a ratio of the resistance values of the first and second resistors Ra and Rb. The divided voltage VPP_REF is output via a common node between the first resistor Ra and the second resistor Rb.

The comparison unit 200 includes a bias NMOS transistor MN11, PMOS transistors MP11 and MP12, NMOS transistors MN12 and MN13 and an inverter INV0. The bias NMOS transistor MN11 is connected to a ground voltage VSS and receives an internal voltage generating enable signal Vgen_ctrl through a gate input terminal thereof. The PMOS transistors MP11 and MP12 are connected to an external power voltage VDD and gates of the PMOS transistors MP11 and MP12 are coupled to each other in order to form a current mirror. The input NMOS transistors MN12 and MN13 are connected to the bias NMOS transistor MN11 and also respectively connected to the PMOS transistors MP11 and MP12. The divided voltage VPP_REF and the reference voltage VREFC, as differential inputs, are applied to two gates of the NMOS transistors MN12 and MN13. The inverter INV0 is connected to a comparison output terminal (common drain of the PMOS transistors MP12 and NMOS transistors MN13) and produces a level detection signal PPE.

The boosted voltage level detector, as described above, detects a state in which the boosted voltage level is lower than a target voltage level, by comparing the divided voltage VPP_REF corresponding to the present boosted voltage VPP with the reference voltage VREFC corresponding to the target boost voltage VPP, by producing the level detection signal PPE in a high level when the divided voltage VPP_REF is higher than the reference voltage VREFC and by producing the level detecting signal PPE in a low level when the divided voltage VPP_REF is lower than the reference voltage VREFC.

However, with the increase of temperature, the conventional level detector of the boosted voltage VPP inevitably undergoes an increasing value of the resistance of the resistors Ra an Rb which are used for producing the divided voltage VPP_REF. That is, the resistors Ra and Rb altogether have a positive temperature coefficient.

Since the resistors Ra and Rb both have the same temperature characteristic, it is difficult to compensate for the loss caused by the resistance variation according to the temperature change. Typically, the reference voltage VREFC has a low electric potential in a low temperature condition. As the level detection signal PPE is based on the level of VREFC, the electrical potential of the boosted voltage VPP is set up less than the target level in a low temperature environment. The boosted voltage level can decrease to a level that generates a test failure. In addition, a write recovery time (tWR) characteristic at the low temperature environment is poor.

SUMMARY OF THE INVENTION

Embodiments of the present invention are directed to provide a voltage level detector capable of preventing instability of a voltage level of a boosted voltage at a low temperature environment in a semiconductor memory device.

In accordance with an aspect of the present invention, there is provided a boosted voltage level detector in a semiconductor memory device comprising: a voltage divider for dividing a boosted voltage and outputting a divided voltage; and a comparison unit for comparing a reference voltage corresponding to a voltage level of a target voltage with the divided voltage and outputting a level detection signal, wherein the voltage divider includes: a first voltage drop element, connected between a boosted voltage terminal and an output terminal of the voltage divider, having a negative temperature coefficient; and a second voltage drop element, connected between the output terminal of the voltage divider and a ground voltage terminal, having a positive temperature coefficient.

In accordance with another aspect of the present invention, there is provided a boosted voltage level detector in a semiconductor memory device comprising: a voltage divider for dividing a boosted voltage and outputting a divided voltage; and a threshold voltage detecting means for detecting whether the divided voltage is higher than a predetermined critical voltage or not, wherein the voltage divider includes: a first voltage drop element, connected between a boosted voltage terminal and an output terminal of the voltage divider, having a negative temperature coefficient; and a second voltage drop element, connected between the output terminal of the voltage divider and a ground voltage terminal, having a positive temperature coefficient.

In accordance with further another aspect of the present invention, there is provided a method for detecting a voltage level of a boosted voltage in a semiconductor memory device comprising: dividing the boosted voltage by using both a first voltage drop element having a negative temperature coefficient and a second voltage drop element having a positive temperature coefficient; and producing a level detection signal in response to a divided voltage.

In the preferred embodiment, the first voltage drop element includes an active circuit resistor. The active circuit resistor is a diode-connected bipolar transistor or a diode-connected MOS transistor. Preferably, the second voltage drop element is a passive resistor.

In the present invention, a voltage divider which divides a boosted voltage (VPP) and outputs the divided voltage includes a voltage drop element which has a negative temperature coefficient (the higher temperature is, the lower the resistance value is). That is, the voltage division is performed by the voltage drop elements having the negative temperature coefficient and the positive temperature coefficient (the higher temperature is, the higher the resistance value is) so that it is possible to prevent a target voltage of the boosted voltage (VPP) from being set up at a low target voltage.

DESCRIPTION OF SPECIFIC EMBODIMENTS

In the present invention, a voltage divider which divides a boosted voltage VPP and outputs a divided voltage includes a voltage drop element which has a negative temperature coefficient (the higher temperature is, the lower the resistance value is). That is, the voltage division is performed by the voltage drop elements having the negative temperature coefficient and the positive temperature coefficient (the higher temperature is, the higher the resistance value is) so that it is possible to prevent the boosted voltage VPP from being set up to a low target voltage at a low temperature environment. The present invention prevents the boosted voltage VPP from being targeted at a low voltage level, thereby improving a write recovery time (tWR) characteristic.

Hereinafter, a semiconductor memory device in accordance with the present invention will be described in detail referring to the accompanying drawings.

Figure 1:
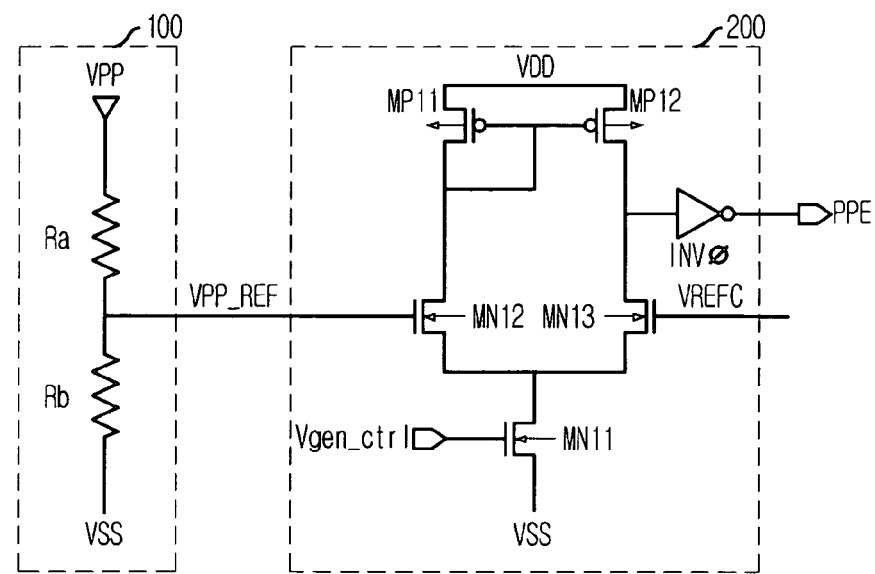
FIG. 1 is a circuit diagram of a boosted voltage level detector according to a conventional memory device.
Figure 2:
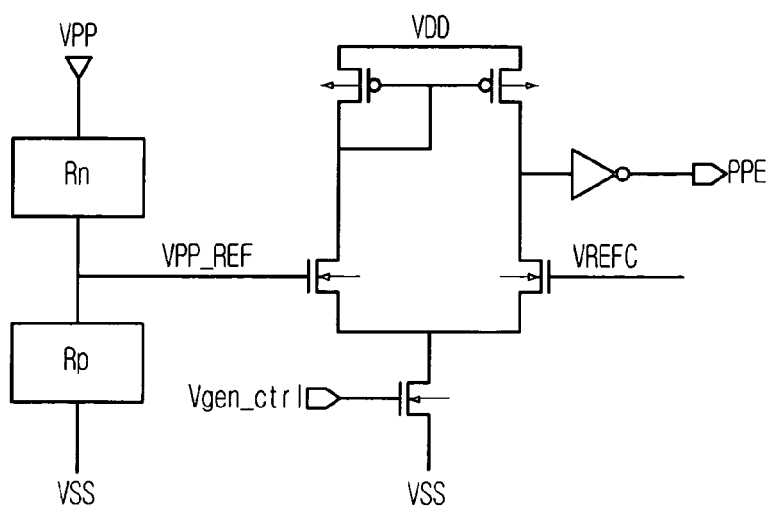
FIG. 2 is a circuit diagram of a boosted voltage level detector according to one embodiment of the present invention.

FIG. 2 is a circuit diagram of a boosted voltage level detector according to one embodiment of the present invention. Similar to the conventional boosted voltage VPP level detector described in FIG. 1, the boosted voltage level detector according to one embodiment of the present invention includes a voltage divider and a comparison unit; however, the voltage divider has a configuration which is different from that of the conventional boosted voltage level detector described in FIG. 1.

That is, the voltage divider of the boosted voltage level detector according to one embodiment of the present invention includes a first voltage drop element Rn having a negative temperature coefficient and a second voltage drop element Rp having a positive temperature coefficient. The first voltage drop element Rn is connected between a boosted voltage supplier and an output terminal of the voltage divider and the second voltage drop element Rp is connected between the output terminal of the voltage divider and a ground voltage VSS.

A divided voltage which is produced by the voltage divider is determined based on the following equation.

$$VPP\_REF = (Rp/(Rn+Rp)) \times VPP$$

Since the first voltage drop element Rn has the negative temperature coefficient, the resistance value of the first voltage drop device Rn becomes higher when the temperature becomes lower. Further, since the second voltage drop device part Rp has the positive temperature coefficient, the resistance value of the second voltage drop device part Rp becomes lower when the temperature becomes lower.

Referring to the above-mentioned equation, the level of the divided voltage VPP_REF relatively decreases at a low temperature environment. Because the decreased divided voltage VPP_REF is used to be matched to a reference voltage VREFC, the level of the boosted voltage will be relatively higher than a target level. This increasing factor compensates for the voltage drop of the boosted voltage VPP when a reference voltage VREFC is low due to a low temperature environment, thereby stabilizing the voltage level of the boosted voltage VPP.

Figure 3:
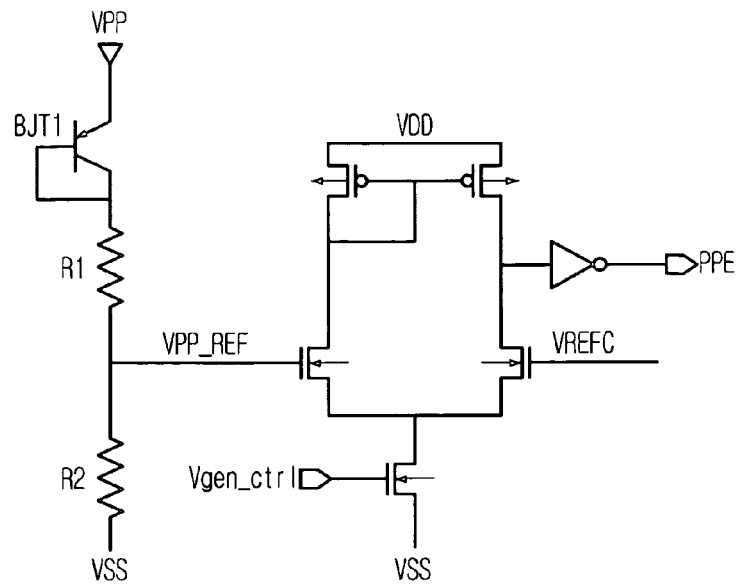
FIG. 3 is a circuit diagram of a first implementation of a voltage divider described in FIG. 2.

FIG. 3 is a circuit diagram of a first implementation of the voltage divider described in FIG. 2. The first voltage drop element Rn includes a diode-connected bipolar transistor BJT1 and a resistor R1 and the second voltage drop element Rp includes only a resistor R2. It is possible to change an arrangement order of the bipolar transistor BJT1 and the resistor R1.

Figure 4:
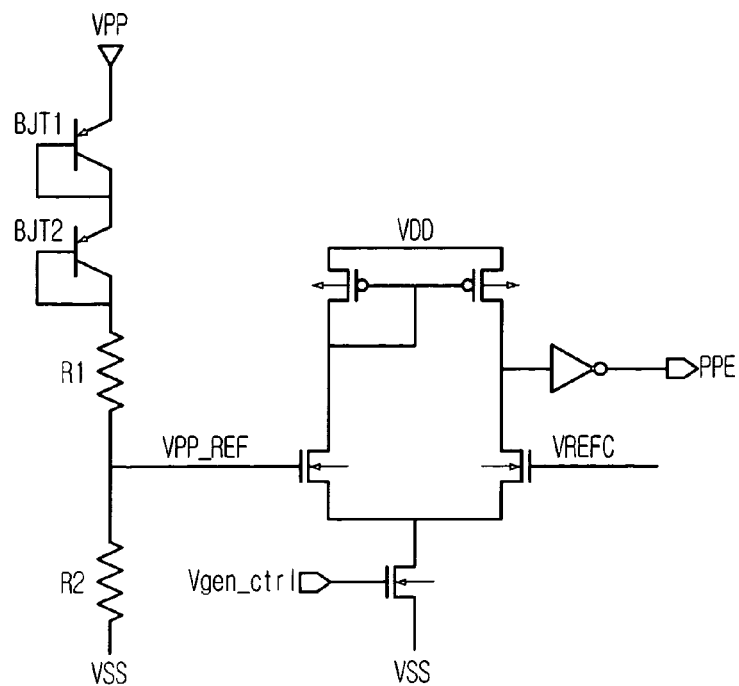
FIG. 4 is a circuit diagram of a second implementation of the voltage divider described in FIG. 2.

FIG. 4 is a circuit diagram of a second implementation of the voltage divider described in FIG. 2. The first voltage drop element Rn includes two diode-connected bipolar transistors BJT1 and BJT2 and a resistor R1 and the second voltage drop element Rp includes only a resistor R2. It is possible to change an arrangement order of the bipolar transistors BJT1 and BJT2 and the resistor R1.

Figure 5:
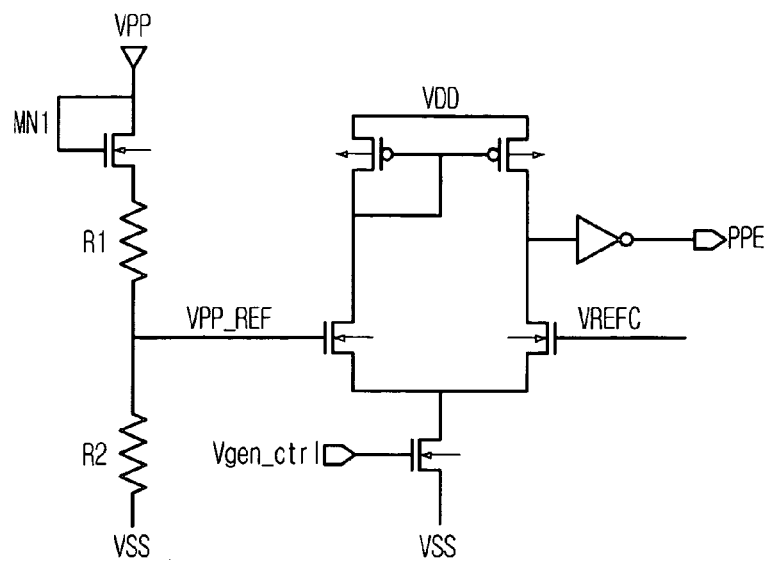
FIG. 5 is a circuit diagram of a third implementation of the voltage divider described in FIG. 2.

FIG. 5 is a circuit diagram of a third implementation of the voltage divider described in FIG. 2. The first voltage drop element Rn includes a diode-connected NMOS transistor MN1 and a resistor R1 and the second voltage drop element Rp includes only a resistor R2. It is possible to change an arrangement order of the NMOS transistor MN1 and the resistor R1.

Figure 6:
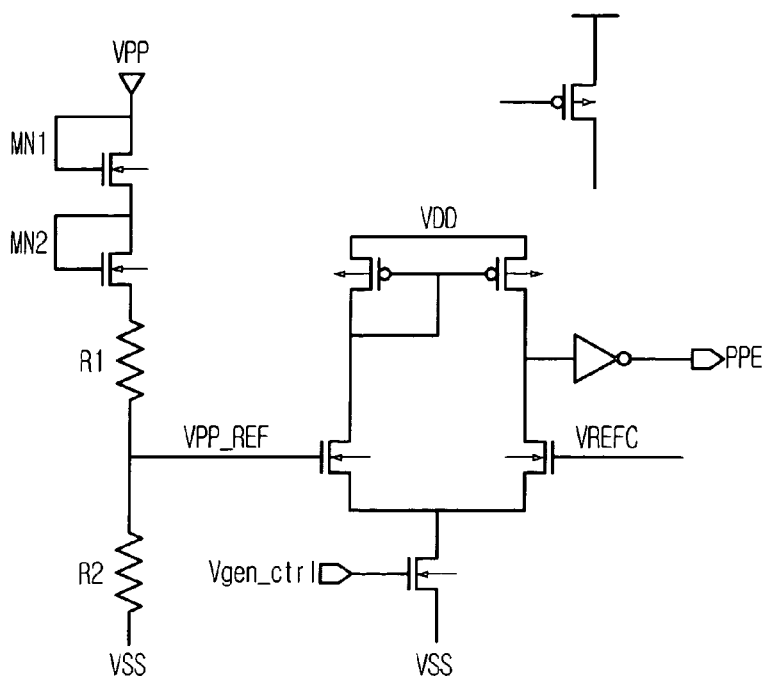
FIG. 6 is a circuit diagram of a fourth implementation of the voltage divider described in FIG. 2.

FIG. 6 is a circuit diagram of a fourth implementation of the voltage divider described in FIG. 2. The first voltage drop element Rn includes two diode-connected NMOS transistors MN1 and MN2 and a resistor R1 and the second voltage drop element Rp includes only a resistor R2. It is possible to change an arrangement order of the NMOS transistors MN1 and MN2 and the resistor R1.

Figure 7:
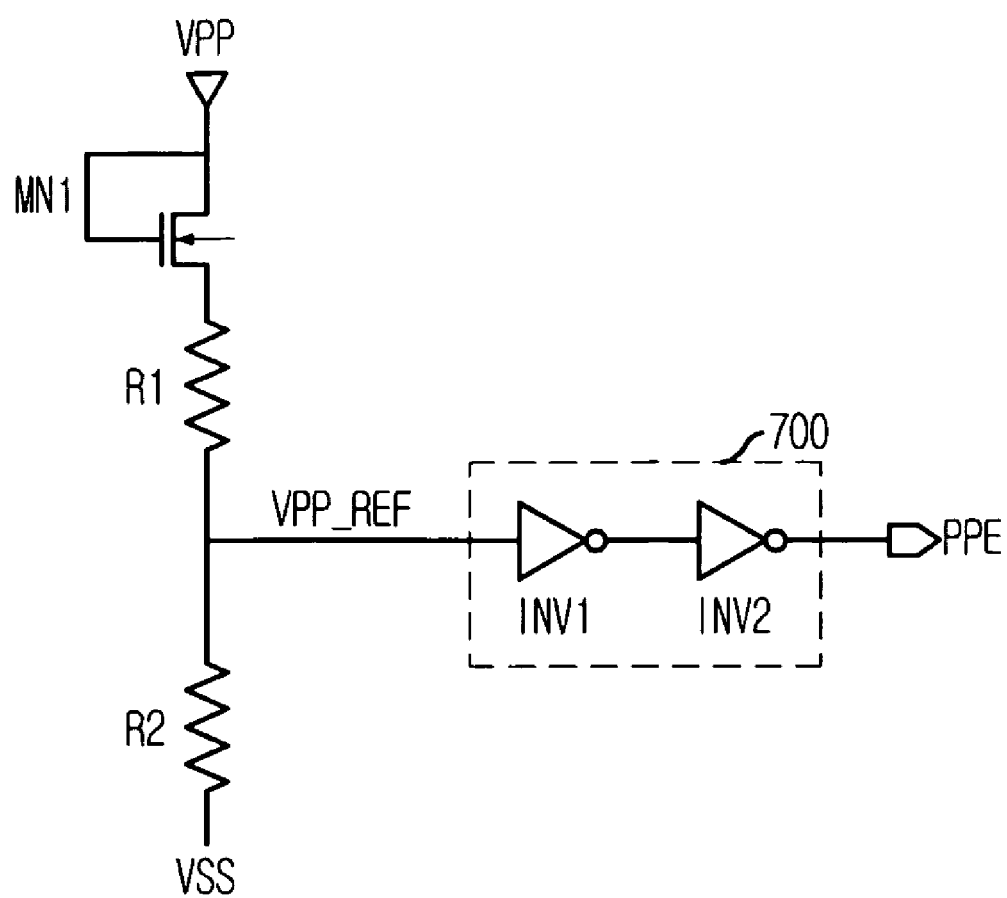
FIG. 7 is a circuit diagram of a boosted voltage level detector according to another embodiment of the present invention.

FIG. 7 is a circuit diagram of the boosted voltage level detector according to another embodiment of the present invention. Different from the above-mentioned boosted voltage level detector with the comparison unit, the boosted voltage VPP level detector according to this embodiment of the present invention employs a threshold voltage detector 700 in order to produce the level detection signal PPE.

The threshold voltage detector 700 includes a first inverter INV1 for receiving the divided voltage VPP_REF and a second inverter INV2 for receiving an output of the first inverter INV1. The threshold voltage detector 700 activates the level detection signal PPE in a high level when the level of the divided voltage VPP_REF is higher than the logic threshold value of the first inverter INV1.

The threshold voltage detector 700 is illustrated in the context of the third implementation voltage divider described in FIG. 5; however, other voltage dividers can be applicable to the threshold voltage detector 700 described in FIG. 7.

While the present invention has been described with respect to the specific embodiments, it will be apparent to those skilled in the art that various changes and modifications may be made without departing from the spirit and scope of the invention as defined in the following claims.

What is claimed is:

1. A boosted voltage level detector in a semiconductor memory device comprising:
    a voltage divider for dividing a boosted voltage and outputting a divided voltage; and
    a comparison unit for comparing a reference voltage corresponding to a voltage level of a target voltage with the divided voltage and outputting a level detection signal, wherein the voltage divider includes:
    a first voltage drop element connected between a boosted voltage terminal and an output terminal of the voltage divider, having a negative temperature coefficient; and
    a second voltage drop element connected between the output terminal of the voltage divider and a ground voltage terminal, having a positive temperature coefficient.

2. The boosted voltage level detector of claim 1, wherein the first voltage drop element includes an active circuit resistor.

3. The boosted voltage level detector of claim 2, wherein the active circuit resistor is a diode-connected bipolar transistor or a diode-connected MOS transistor.

4. The boosted voltage level detector of claim 3, wherein the first voltage drop element includes a passive resistor.

5. A boosted voltage level detector in a semiconductor memory device comprising:
    a voltage divider for dividing a boosted voltage and outputting a divided voltage; and
    a threshold voltage detecting means for detecting whether the divided voltage is higher than a predetermined critical voltage or not, wherein the voltage divider includes:
    a first voltage drop element connected between a boosted voltage terminal and an output terminal of the voltage divider, having a negative temperature coefficient; and
    a second voltage drop element connected between the output terminal of the voltage divider and a ground voltage terminal, having a positive temperature coefficient.

6. The boosted voltage level detector of claim 5, wherein the first voltage drop element includes an active circuit resistor.

7. The boosted voltage level detector of claim 6, wherein the active circuit resistor is a diode-connected bipolar transistor or a diode-connected MOS transistor.

8. The boosted voltage level detector of claim 7, wherein the first voltage drop element includes a passive resistor.

9. A method for detecting a voltage level of a boosted voltage in a semiconductor memory device comprising:
    dividing the boosted voltage by using both a first voltage drop element having a negative temperature coefficient and a second voltage drop element having a positive temperature coefficient; and
    producing a level detection signal in response to a divided voltage.

* * * * *